United States Patent
Scanlan et al.

(10) Patent No.: US 6,494,361 B1
(45) Date of Patent: Dec. 17, 2002

(54) SEMICONDUCTOR MODULE PACKAGE SUBSTRATE FABRICATION METHOD

(75) Inventors: Christopher Scanlan, Phoenix, AZ (US); Jon G. Aday, Gilbert, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/770,861

(22) Filed: Jan. 26, 2001

(51) Int. Cl.[7] .............................................. B23K 31/02
(52) U.S. Cl. ...................................... 228/223; 228/218
(58) Field of Search ...................... 228/248.1, 248.5, 228/207, 223, 218; 148/24

(56) References Cited

U.S. PATENT DOCUMENTS

| | | | |
|---|---|---|---|
| 5,918,364 A | * 7/1999 | Kulesza et al. | 29/832 |
| 5,939,783 A | * 8/1999 | Laine et al. | 257/702 |
| 5,985,456 A | * 11/1999 | Zhou et al. | 428/414 |
| 6,013,417 A | * 1/2000 | Sebesta et al. | 430/312 |
| 6,044,550 A | * 4/2000 | Larson | 29/852 |
| 6,165,885 A | * 12/2000 | Gaynes et al. | 438/312 |
| 6,281,046 B1 | * 8/2001 | Lam | 438/113 |
| 6,316,830 B1 | 11/2001 | Lin | 257/737 |
| 6,319,751 B1 | 11/2001 | Lin | 438/108 |

OTHER PUBLICATIONS

Scalan et al., U.S. patent application Ser. No. 09/770,859, filed Jan. 26, 2001, entitled "Semiconductor Module Package Substrate".*

* cited by examiner

Primary Examiner—M. Alexandra Elve
Assistant Examiner—Len Tran
(74) Attorney, Agent, or Firm—Gunnison, McKay & Hodgson, L.L.P.; Serge J. Hodgson

(57) ABSTRACT

Organic solderability protectant (OSP) is applied to copper bond pads. The copper bond pads include flip chip bond pads and SMD bond pads on a dielectric upper surface and BGA bond pads on a dielectric lower surface. Solder paste is applied to the flip chip bond pads. This solder paste is reflowed in an inert atmosphere to form solder-on-pads (SOPs) on the flip chip bond pads. Flux residue from the solder paste is then removed with water. By reflowing the solder paste in an inert atmosphere and removing the flux residue with water, degradation of the OSP and oxidation of the SMD and BGA bond pads is inhibited.

24 Claims, 5 Drawing Sheets

SEMICONDUCTOR MODULE PACKAGE SUBSTRATE FABRICATION METHOD

BACKGROUND OF THE INVENTION

1. Field of the Invention

The present invention relates generally to electronic component packaging and more particularly to a method of fabricating a substrate for a module package.

2. Description of Related Art

A high density build-up laminate substrate was commonly used as an interposer for a high pin-count flip chip integrated circuit package. In this flip chip integrated circuit package, the die pads of the integrated circuit chip were bumped with solder bumps. The integrated circuit chip was then placed on the substrate such that the solder bumps were placed in contact with solderable flip chip bond pads of the substrate. The assembly was then heated to reflow the solder bumps and thus form the electrical connections between the die pads of the die and the flip chip bond pads of the substrate in a well-known manner.

Two types of bond pads of the substrate were commonly used. With a non-solder mask defined (NSMD) bond pad, the wettable area of a bond pad of the substrate was defined by the edge of the metallic trace which formed the bond pad, i.e., the bond pad itself defined the wettable area. However, use of the NSMD bond pad resulted in cracking of the dielectric buildup layer. Consequently, the reliability and assembly yield of the flip chip integrated circuit package was undesirably reduced.

Alternatively, with a solder mask defined (SMD) bond pad, the wettable area of a bond pad of the substrate was defined by the solder mask, i.e., a portion of the metallization which formed the bond pad was exposed through the solder mask, and this portion of the metallization defined the wettable area of the SMD bond pad.

However, use of the SMD bond pad as a flip chip SMD bond pad greatly reduced the collapse of the solder bump on the die pad of the integrated circuit chip during flip chip attachment of the integrated circuit chip to the substrate. Disadvantageously, this increased the probability of an open solder joint connection between a die pad of the integrated circuit chip and a flip chip SMD bond pad of the substrate resulting in an undesirable assembly yield loss. To decrease this probability of an open solder joint connection, a controlled amount of solder was applied to the flip chip SMD bond pad of the substrate. This solder on the flip chip SMD bond pad was commonly referred to as a solder-on-pad (SOP).

FIG. 1 is a cross-sectional view of a flip chip ball grid array substrate 10 in accordance with the prior art. Substrate 10 included a central dielectric layer 12, an upper dielectric layer 14, and a lower dielectric layer 16. Upper dielectric layer 14 and lower dielectric layer 16 were commonly referred to as dielectric buildup layers.

Formed on upper dielectric layer 14 were metallizations 18, sometimes called traces. An upper solder mask 20 was patterned to expose portions of metallizations 18 to form flip chip SMD bond pads. Solder-on-pads 22, i.e., solder, were formed on these flip chip SMD bond pads.

Formed on lower dielectric layer 16 were metallizations 24, sometimes called traces. A lower solder mask 26 was patterned to expose portions of metallizations 24 to form ball grid array (BGA) SMD bond pads 28. BGA solder balls (not shown) were formed on BGA SMD bond pads 28. To allow BGA solder balls to be formed on BGA SMD bond pads 28, it was important that BGA SMD bond pads 28 were wettable with solder.

There were several surface finishes that were used to insure that BGA SMD bond pads 28 were wettable. Among these were electrolytic Ni/Au plating, electroless Ni/Au plating, full body gold, and copper with a coating of organic solderability protectant (OSP).

With electrolytic Ni/Au plating, it was often difficult to provide bus bars required for the electroplating thus making electrolytic Ni/Au plating impractical for many applications. On the other hand, electroless Ni/Au plating resulted in the formation of a brittle intermetallic between the BGA solder ball and the electroless Ni/Au plating, which undesirably caused failure in the BGA solder joint.

With full body gold, metallizations 18, 24 were entirely covered with a layer of gold. Solder masks 20, 26 were formed on this layer of gold. However, since solder masks 20, 26 had poor adhesion to gold as compared to copper, failures due to the delamination of solder masks 20, 26 occurred.

For the above reasons, metallizations 24 formed of copper and coated with organic solderability protectant formed the optimum surface finish for BGA SMD bond pads 28. However, there were inherent difficulties in applying the organic solderability protectant to metallizations 24.

Solder-on-pads 22 were initially formed on metallizations 18. A tape material 30 was applied to cover and protect solder-on-pads 22. Substrate 10 was then subjected to an OSP etch process as indicated by the arrows 32. This OSP etch process was necessary to remove oxidation and impurities on BGA SMD bond pads 28. Tape material 30 prevented the chemical etchant from attacking solder-on-pads 22. The organic solderability protectant was then applied to BGA SMD bond pads 28.

Tape material 30 was then removed. Undesirably, tape material 30 left a residue on solder-on-pads 22 which increased the probability of open solder joint formation during flip chip attachment of the integrated circuit chip to substrate 10 and thus reduced assembly yield. Further, use of tape material 30 was relatively complex, labor-intensive, and thus expensive.

SUMMARY OF THE INVENTION

In accordance with one embodiment of the present invention, a method of forming a substrate includes an organic solderability protectant (OSP) etch operation to prepare solder mask defined (SMD) bond pads on an upper surface and a lower surface of a dielectric substrate layer for subsequent OSP application. In an OSP application operation, organic solderability protectant is applied to all of the solder mask defined bond pads, e.g., to flip chip SMD bond pads, to ball grid array (BGA) SMD bond pads and to surface mounted device SMD bond pads.

In a solder paste application operation, solder paste is applied on the flip chip SMD bond pads. In a solder paste reflow operation, the solder paste is reflowed to form solder-on-pads (SOPs) on the flip chip SMD bond pads. This reflow is performed in an inert atmosphere, e.g., in an oxygen deficient atmosphere, to inhibit oxidation of the organic solderability protectant on the remaining SMD bond pads, e.g., on the BGA SMD bond pads and the surface mounted device SMD bond pads, and also to inhibit oxidation of the remaining SMD bond pads themselves.

Recall that in the prior art, the solder-on-pads were formed prior to application of the organic solderability protectant on the BGA SMD bond pads. The organic solderability protectant had to be applied after the solder-on-pads were formed because otherwise the organic solderability protectant would have degraded during the formation of the solder-on-pads thus unacceptably exposing and subjecting to oxidation the BGA SMD bond pads. Disadvantageously, tape material had to be utilized to protect the solder-on pads during the OSP etching and application processes. However, use of the tape material to protect the solder-on-pads was relatively complex, labor-intensive, and expensive.

In stark contrast, the solder-on-pads are formed after the OSP etch operation and the OSP application operation in accordance with the present invention. Accordingly, use of the tape material of the prior art and the associated complexity and cost to protect the solder-on-pads is avoided.

In accordance with one embodiment of the present invention, during a flux residue removal operation, flux residue generated during the reflow of the solder paste to form the solder-on-pads is removed. The flux residue is removed using water. Advantageously, by using water, degradation of the organic solderability protectant of the remaining SMD bond pads, e.g., on the BGA SMD bond pads and the surface mounted device SMD bond pads, is inhibited.

Also in accordance with the present invention, a substrate is presented. The substrate includes a flip chip bond pad and a first bond pad coupled to a dielectric substrate layer. A first organic solderability protectant layer is on the flip chip bond pad. A second organic solderability protectant layer is on the first bond pad.

In an alternative embodiment, a substrate includes a dielectric substrate layer. A first flip chip solder mask defined bond pad and a first solder mask defined bond pad are on the dielectric substrate layer. A first organic solderability protectant layer is on the first flip chip solder mask defined bond pad. A first solder paste is on the first organic solderability protectant layer. A second organic solderability protectant layer is on the first solder mask defined bond pad.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
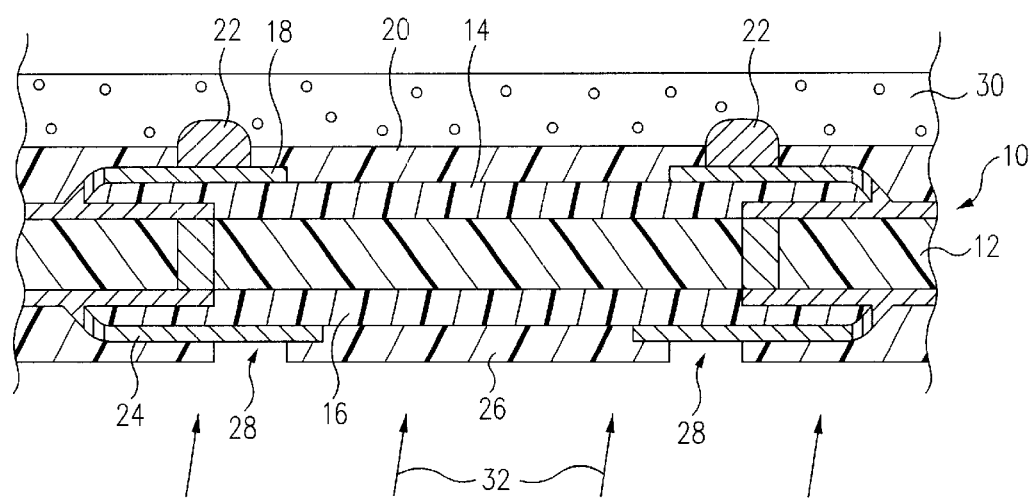
FIG. 1 is a cross-sectional view of a flip chip ball grid array substrate in accordance with the prior art.

In accordance with one embodiment of the present invention, a method of forming a substrate includes an organic solderability protectant (OSP) etch operation 202 (FIGS. 2, 3) to prepare flip chip solder mask defined bond pads 321A, 321B, an upper solder mask defined bond pad 350 and a lower solder mask defined bond pad 328 for subsequent OSP application. In an OSP application operation 204 (FIGS. 2, 4), organic solderability protectant (OSP) layers 410A, 410B, 412, 414 are formed on flip chip solder mask defined bond pads 321A, 321B, upper solder mask defined bond pad 350 and lower solder mask defined bond pad 328, respectively.

In a solder paste application operation 206 (FIGS. 2, 5), solder pastes 522A, 522B are applied on flip chip SMD bond pads 321A, 321B, respectively. In a solder paste reflow operation 208 (FIGS. 2, 5 and 6), solder pastes 522A, 522B are reflowed to form solder-on-pads (SOPs) 622A, 622B on flip chip SMD bond pads 321A, 321B, respectively. This reflow is performed in an inert atmosphere, e.g., in an oxygen deficient atmosphere, to inhibit oxidation of OSP layers 412, 414 and solder mask defined bond pads 350, 328.

Recall that in the prior art, solder-on-pads 22 (FIG. 1) were formed prior to application of organic solderability protectant on BGA SMD bond pads 28. The organic solderability protectant had to be applied after the solder-on-pads 22 were formed because otherwise the organic solderability protectant would have degraded during the formation of solder-on-pads 22 thus unacceptably exposing and subjecting to oxidation BGA SMD bond pads 28. Disadvantageously, tape material 30 had to be utilized to protect solder-on-pads 22 during the OSP etching and application process. However, use of tape material 30 to protect solder-on-pads 22 was relatively complex, labor-intensive, and expensive.

In stark contrast, referring again to FIGS. 2 and 6 together, solder-on-pads 622A, 622B are formed after OSP etch operation 202 and OSP application operation 204. Accordingly, use of a tape material of the prior art and the associated complexity and cost to protect solder-on-pads 622A, 622B is avoided.

In accordance with one embodiment of the present invention, during a flux residue removal operation 210 (FIGS. 2, 6), flux residue 604 generated during solder paste reflow operation 208 is removed. Flux residue 604 is removed using water. Advantageously, by using water, degradation of OSP layers 412, 414 is inhibited.

Figure 2:
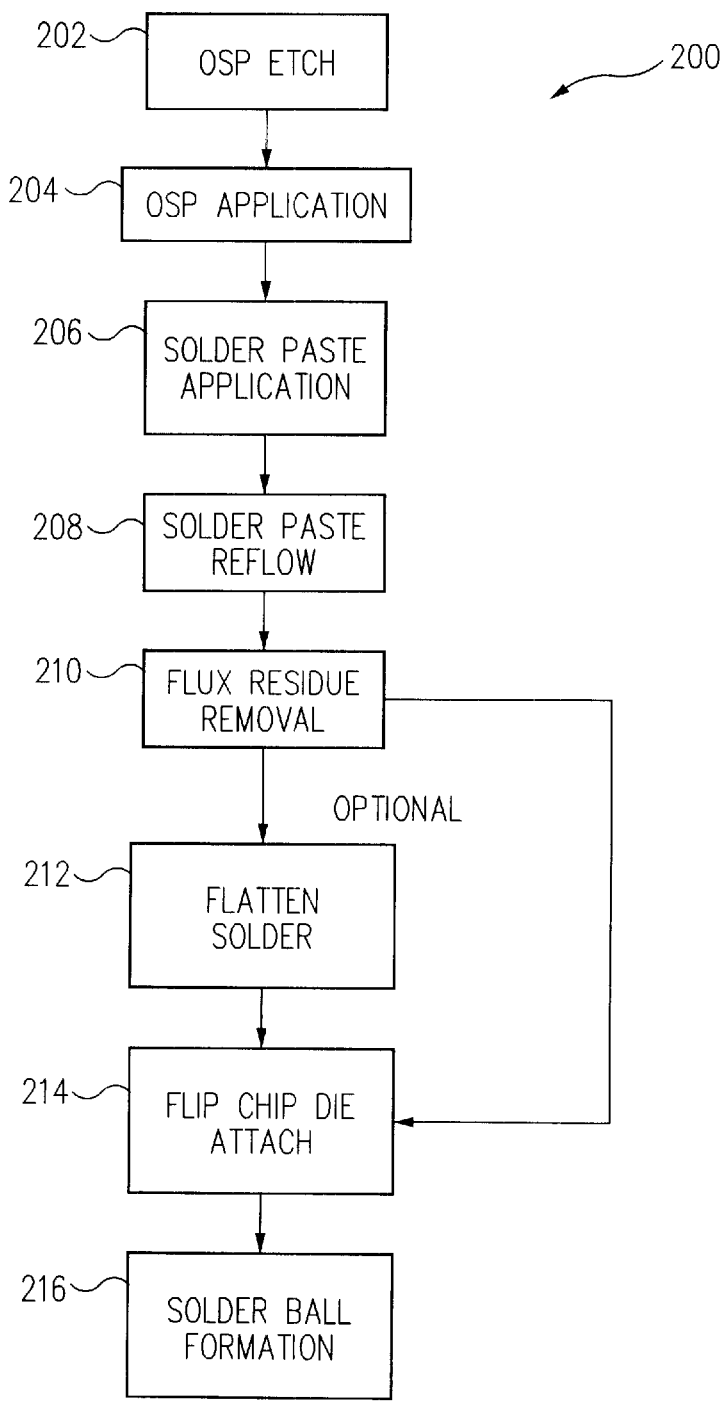
FIG. 2 is a block diagram illustrating operations in a process for substrate formation in accordance with the present invention.
Figure 3:
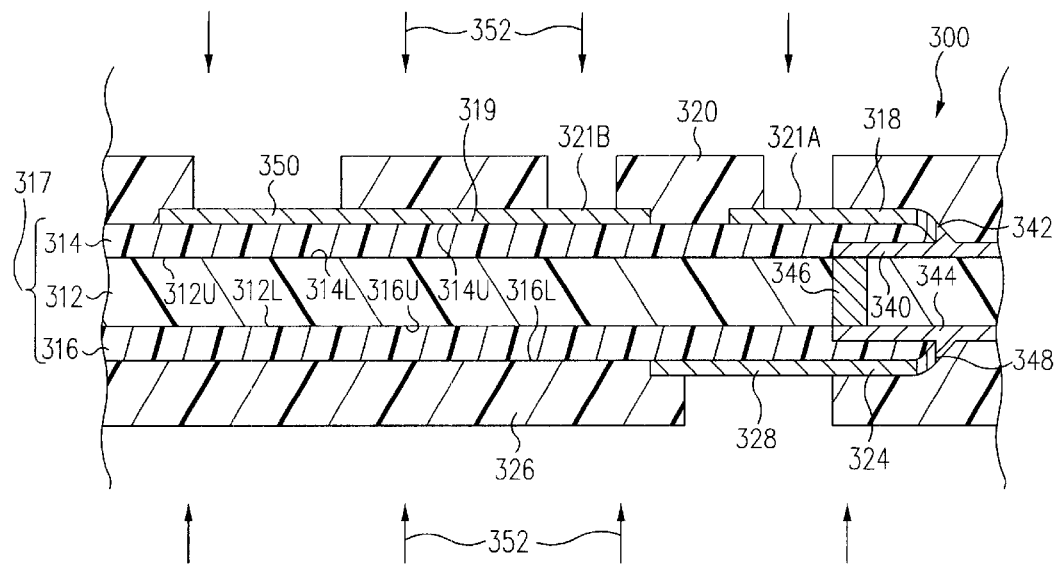
FIG. 3 is a cross-sectional view of a substrate during processing in accordance with one embodiment of the present invention.

More particularly, FIG. 2 is a block diagram illustrating operations in a process 200 for substrate formation in accordance with the present invention. FIG. 3 is a cross-sectional view of a substrate 300 during processing in accordance with one embodiment of the present invention.

Referring now to FIG. 3, substrate 300 includes a central, e.g., first, dielectric layer 312, an upper, e.g., second, dielectric layer 314, and a lower, e.g., third, dielectric layer 316. More particularly, central dielectric layer 312 includes an upper, e.g., first, surface 312U and a lower, e.g., second, surface 312L. A lower, e.g., first, surface 314L of upper dielectric layer 314 is bonded to upper surface 312U of central dielectric layer 312. Similarly, an upper, e.g., first, surface 316U of lower dielectric layer 316 is bonded to lower surface 312L of central dielectric layer 312.

Formed on an upper, e.g., second, surface 314U of upper dielectric layer 314 is an electrically conductive upper, e.g., first, metallization 318 and an electrically conductive upper metallization 319, sometimes also called a first metallization. In one embodiment, upper metallizations 318, 319 are copper.

Upper metallization 318 is electrically connected to an electrically conductive upper, e.g., first, interlayer metallization 340 by an electrically conductive upper via 342. Upper via 342 extends between upper surface 314U and lower surface 314L of upper dielectric layer 314. Upper interlayer metallization 340 is formed on upper surface 312U of central dielectric layer 312 and extends between central dielectric layer 312 and upper dielectric layer 314.

Upper interlayer metallization 340 is electrically connected to an electrically conductive lower, e.g., second, interlayer metallization 344 by an electrically conductive central via 346. Central via 346 extends between upper surface 312U and lower surface 312L of central dielectric layer 312. Lower interlayer metallization 344 is formed on lower surface 312L of central dielectric layer 312 and extends between central dielectric layer 312 and lower dielectric layer 316.

Lower interlayer metallization 344 is electrically connected to an electrically conductive lower, e.g., second, metallization 324 by an electrically conductive lower via 348. Lower via 348 extends between upper surface 316U and lower surface 316L of lower dielectric layer 316. Lower metallization 324 is formed on lower surface 316U of lower dielectric layer 316. In one embodiment, lower metallization 324 is copper.

As set forth above, an electrically conductive pathway between upper metallization 318 and lower metallization 324 is formed by upper via 342, upper interlayer metallization 340, central via 346, lower interlayer metallization 344, lower via 348. In light of this disclosure, those of skill in the art will understand that substrate 300 includes a plurality of upper metallizations 318, 319, upper vias 342, upper interlayer metallizations 340, central vias 346, lower interlayer metallizations 344, lower vias 348 and lower metallizations 324, which are electrically connected to one another in a similar fashion to that described above so are not discussed further to avoid detracting from the principals of the invention.

Although a particular electrically conductive pathway between upper metallization 318 and lower metallization 324 is described above, in light of this disclosure, those of skill in the art will recognize that other electrically conductive pathways can be formed. For example, instead of having a single upper dielectric layer 314 and a single lower dielectric layer 316, substrate 300 has multiple upper dielectric layers 314 and/or multiple lower dielectric layers 316, sometimes called dielectric buildup layers, and corresponding electrically conductive interlayer metallizations and vias.

An upper, e.g., first, solder mask 320 is formed on upper surface 314U of upper dielectric layer 314. Solder mask 320 is patterned in a conventional manner to expose a portion of upper metallization 318. This exposed portion of upper metallization 318 forms a first flip chip solder mask defined bond pad 321A. In one embodiment, the term a "flip chip solder mask defined bond pad" as used herein is a bond pad which is, or will be subsequently, electrically and physically coupled to a die pad of a flip chip mounted integrated circuit chip, for example, with solder.

At the same time, solder mask 320 is patterned to expose a first portion of upper metallization 319 and a second portion of upper metallization 319. This exposed first portion of upper metallization 319 forms a second flip chip solder mask defined bond pad 321B on upper surface 314U of upper dielectric layer 314. Further, this exposed second portion of upper metallization 319 forms an upper, e.g., first, solder mask defined bond pad 350 on upper surface 314U of upper dielectric layer 314. Second flip chip solder mask defined bond pad 321B is electrically connected to upper solder mask defined bond pad 350.

Although a particular electrically conductive pathway between flip chip solder mask defined bond pad 321B and upper solder mask defined bond pad 350 is formed by upper metallization 319, in light of this disclosure, those of skill in the art will recognize that other electrically conductive pathways can be formed.

Similarly, a lower, e.g., second, solder mask 326 is formed on lower surface 316L of lower dielectric layer 316. Solder mask 326 is patterned in a conventional manner to expose a portion of lower metallization 324. This exposed portion of lower metallization 324 forms a lower, e.g., second, solder mask defined bond pad 328 on lower surface 316L of lower dielectric layer 316. First flip chip solder mask defined bond pad 321A is electrically connected to lower solder mask defined bond pad 328 as described above.

Collectively, central dielectric layer 312, upper dielectric layer 314, and lower dielectric layer 316 form a dielectric substrate layer 317. Upper surface 314U of upper dielectric layer 314 defines an upper, e.g., first, surface of dielectric substrate layer 317. For clarity of discussion, dielectric substrate layer 317 is hereinafter described as having an upper surface 314U. Similarly, lower surface 316L of lower dielectric layer 316 defines a lower, e.g., second, surface of dielectric substrate layer 317. For clarity of discussion, dielectric substrate layer 317 is hereinafter described as having a lower surface 316L.

It is understood that a plurality of flip chip solder mask defined bond pads including flip chip solder mask defined bond pads 321A, 321B and a plurality of upper solder mask defined bond pads including upper solder mask defined bond pad 350 are on upper surface 314U of dielectric substrate layer 317. Further, is understood that a plurality of lower solder mask defined bond pads including lower solder mask defined bond pad 328 are on lower surface 316L of dielectric substrate layer 317.

Referring now to FIGS. 2 and 3 together, in an organic solderability protectant (OSP) etch operation 202, substrate 300 is subjected to a chemical etch process represented by arrows 352 to prepare SMD bond pads 321A, 321B, 350, 328 for subsequent organic solderability protectant application described further below. Illustratively, oxides, e.g., copper oxide, and/or impurities and/or contaminants are removed from SMD bond pads 321A, 321B, 350, 328 during OSP etch operation 202. OSP etch operations are well known to those of skill in the art and are not discussed further to avoid detracting from the principals of the invention.

Figure 4:
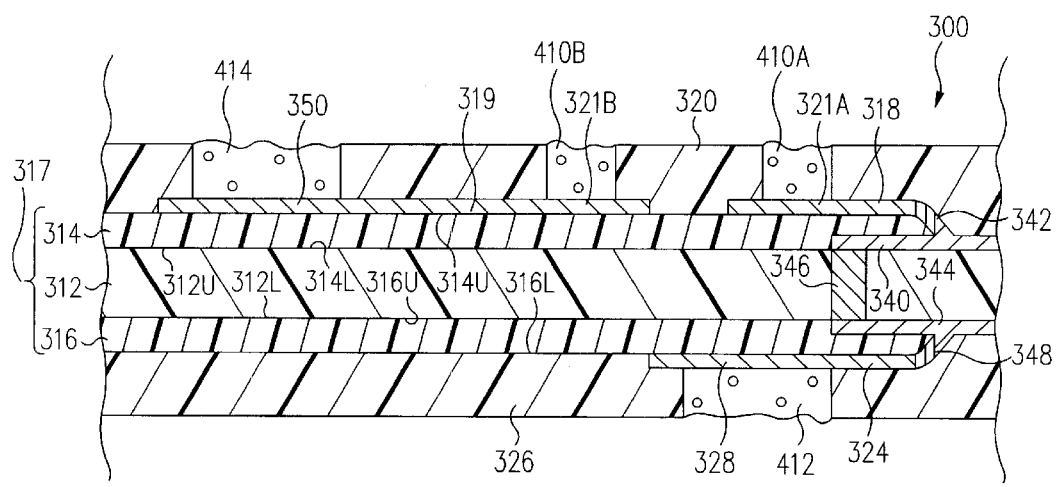
FIGS. 4, 5, 6 and 7 are cross-sectional views of the substrate of FIG. 3 at further stages during processing in accordance with one embodiment of the present invention.

FIG. 4 is a cross-sectional view of substrate 300 at a further stage during processing in accordance with this embodiment of the present invention. Referring now to FIGS. 2 and 4 together, in an OSP application operation 204, organic solderability protectant is applied to SMD bond pads 321A, 321B, 350, 328. More particularly, an OSP layer 410A is formed directly on and contacts flip chip solder mask defined bond pad 321A. Similarly, an OSP layer 410B is formed directly on and contacts flip chip solder mask defined bond pad 321B. An OSP layer 412 is formed directly on and contacts lower solder mask defined bond pad 328. An OSP layer 414 is formed directly on and contacts upper solder mask defined bond pad 350. OSP layers 410A, 410B, 412, 414 are sometimes called solder wetability layers.

In one embodiment, solder masks 320, 326 are approximately 25 $\mu$m thick. The thickness of OSP layers 410A, 410B, 412, 414 is less than the thickness of solder masks 320, 326. Thus, although OSP layers 410A, 410B, 412, 414 are illustrated as being approximately as thick as solder masks 320, 326 in FIG. 4, OSP layers 410A, 410B, 412, 414 are substantially thinner than solder masks 320, 326 in actual application.

In one embodiment, SMD bond pads 321A, 321B, 328, 350 are copper, e.g., pure copper or copper containing. OSP layers 410A, 410B, 412, 414 are an organic coating, i.e., a carbon containing material, which makes SMD bond pads 321A, 321B, 328, 350 have a greater wetability for solder as compared to standard, sometimes called untreated, copper. Illustratively, OSP layers 410A, 410B, 412, 414 are based on a substituted benzimidizole chemistry, for example, are Entek Enthone 106A.

In an alternative embodiment, OSP layers 410A, 410B, 412, 414 are based on a benzitriazole chemistry. However, OSP layers 410A, 410B, 412, 414 based on a benzitriazole chemistry may unacceptably degrade during subsequent processing described further below depending upon the particular application.

More generally, OSP layers 410A, 410B, 412, 414 inhibit bond pads 321A, 321B, 328, 350, respectively, from becoming oxidized. Since solder has a greater tendency to cover and adhere to, i.e., wet, unoxidized copper as compared to oxidized copper, OSP layers 410A, 410B, 412, 414 insure that bond pads 321A, 321B, 328, 350, respectively, are wettable with solder.

Figure 5:
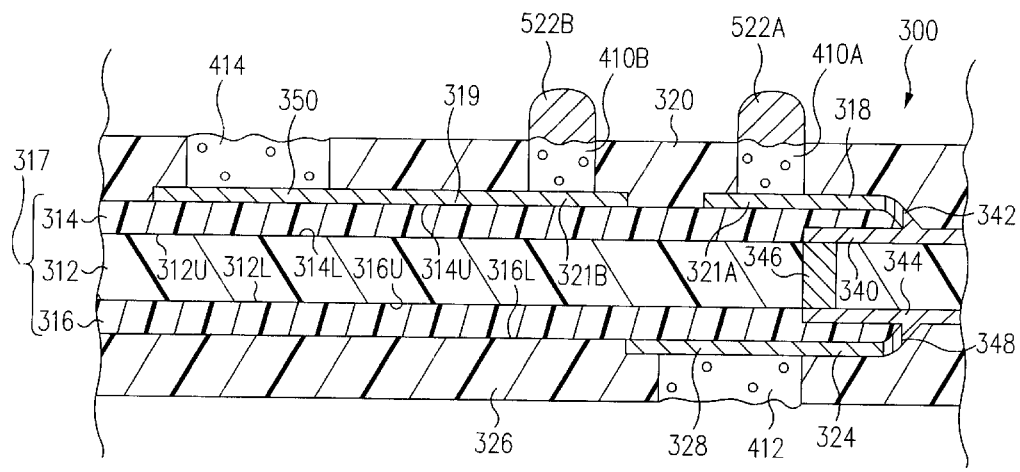

FIG. 5 is a cross-sectional view of substrate 300 at a further stage during processing in accordance with this embodiment of the present invention. Referring now to FIGS. 2 and 5 together, in a solder paste application operation 206, solder pastes 522A, 522B are applied, e.g., by a screen printing method, to flip chip solder mask defined bond pads 321A, 321B, respectively. More particularly, solder pastes 522A, 522B are applied directly to OSP layers 410A, 410B, respectively.

In one embodiment, flip chip solder mask defined bond pads 321A, 321B are fine pitched, i.e., the area of bond pads 321A, 321B is relatively small and the spacing between bond pads 321A, 321B is also relatively small. In accordance with this embodiment, solder pastes 522A, 522B are formed of a solder paste having a maximum particle size which is relatively small. Illustratively, a type 5 solder paste containing a water soluble flux is used. In an alternative embodiment, bond pads 321A, 321B are flip chip nonsolder mask defined (NSMD) bond pads.

Figure 6:
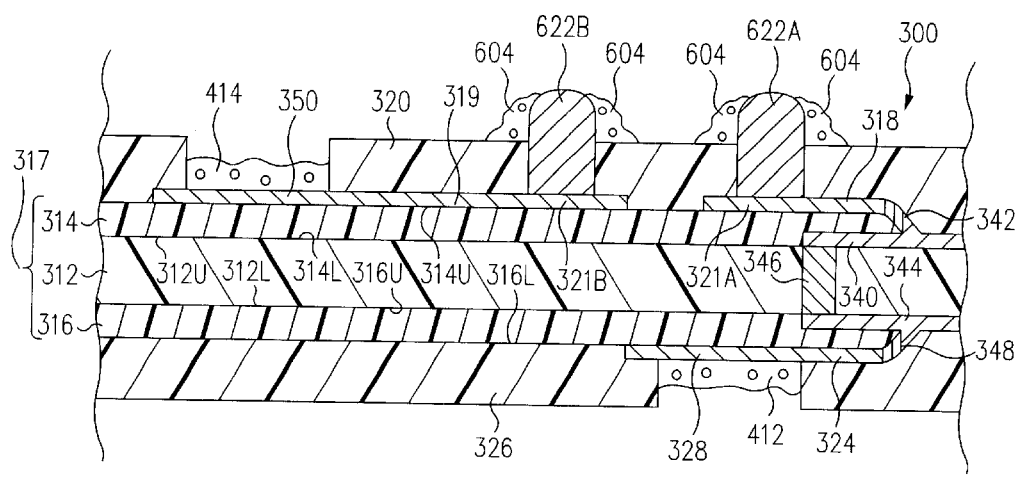

FIG. 6 is a cross-sectional view of substrate 300 at a further stage during processing in accordance with this embodiment of the present invention. Referring now to FIGS. 2 and 6 together, in a solder paste reflow operation 208, solder pastes 522A, 522B are reflowed, i.e., heated to a melt and then cooled to resolidify, to forms solder-on-pads 622A, 622B, respectively. For example, substrate 300 is placed in an oven or other enclosure and heated to reflow solder pastes 522A, 522B to form solder-on-pads 622A, 622B, respectively.

Of importance, reflow of solder pastes 522A, 522B is performed in an inert atmosphere, for example, in a nitrogen atmosphere. More particularly, it is important to reflow solder pastes 522A, 522B in an oxygen deficient atmosphere, i.e., in an atmosphere having a smaller percentage of oxygen than ambient air, to prevent OSP layers 412, 414 from being consumed during this reflow and to inhibit oxidation of solder mask defined bond pads 328, 350.

More particularly, by reflowing solder pastes 522A, 522B in an inert atmosphere, oxidation of OSP layers 412, 414 and solder mask defined bond pads 328, 350 during reflow of solder pastes 522A, 522B is minimized. To illustrate, the thickness of OSP layers 412, 414 after formation of solder-on-pads 622A, 622B as shown in FIG. 6 is less than the thickness of OSP layers 412, 414 prior to formation of solder-on-pads 622A, 622B as shown in FIG. 5.

Advantageously, referring now to FIG. 6, a sufficient thickness of OSP layers 412, 414 remains on lower solder mask defined bond pad 328 and upper solder mask defined bond pad 350, respectively, after formation of solder-on-pads 622A, 622B. More particularly, a sufficient thickness of OSP layers 412, 414 remains to inhibit oxidation of lower solder mask defined bond pad 328 and upper solder mask defined bond pad 350, respectively.

Recall that in the prior art, solder-on-pads 22 (FIG. 1) were formed prior to application of organic solderability protectant on BGA SMD bond pads 28. The organic solderability protectant had to be applied after the solder-on-pads 22 were formed because otherwise the organic solderability protectant would have degraded during the formation of solder-on-pads 22 thus unacceptably exposing and subjecting to oxidation BGA SMD bond pads 28. Disadvantageously, tape material 30 had to be utilized to protect solder-on-pads 22 during the OSP etching and application processes. However, use of tape material 30 to protect solder-on pads 22 was relatively complex, labor-intensive, and expensive.

In stark contrast, referring again to FIGS. 2 and 6 together, solder-on-pads 622A, 622B are formed after OSP etch operation 202 and OSP application operation 204. Accordingly, use of a tape material of the prior art and the associated complexity and cost to protect solder-on-pads 622A, 622B is avoided.

Further, referring again to FIGS. 5 and 6 together, OSP layers 410A, 410B are consumed during formation of solder-on-pads 622A, 622B. Accordingly, formation of solder-on-pads 622A, 622B using OSP layers 410A, 410B allows solder-on-pads 622A, 622B to be formed directly on flip chip solder mask defined bond pads 321A, 321B, respectively. More particularly, contact metallizations, e.g., Ni/Au, between solder-on-pads 622A, 622B and flip chip solder mask defined bond pads 321A, 321B, respectively, are unnecessary. However, in an alternative embodiment, contact metallizations are provided between solder-on-pads 622A, 622B and flip chip solder mask defined bond pads 321A, 321B, respectively. In one embodiment, solder on-pads 622A, 622B are eutectic Sn/Pb solder.

Flux residue 604 is formed on solder mask 320 and solder-on-pads 622A, 622B during reflow of solder pastes 522A, 522B, i.e., during formation of solder-on-pads 622A, 622B. It is important to remove flux residue 604 to avoid contamination of subsequent processing, e.g., to avoid contamination of flip chip mounting of the integrated circuit chip to substrate 300. Advantageously, the flux of solder pastes 522A, 522B is water soluble allowing flux residue 604, which correspondingly is also water soluble, to be removed with water in a flux residue removal operation without harming OSP layers 412, 414 as described below.

Figure 7:
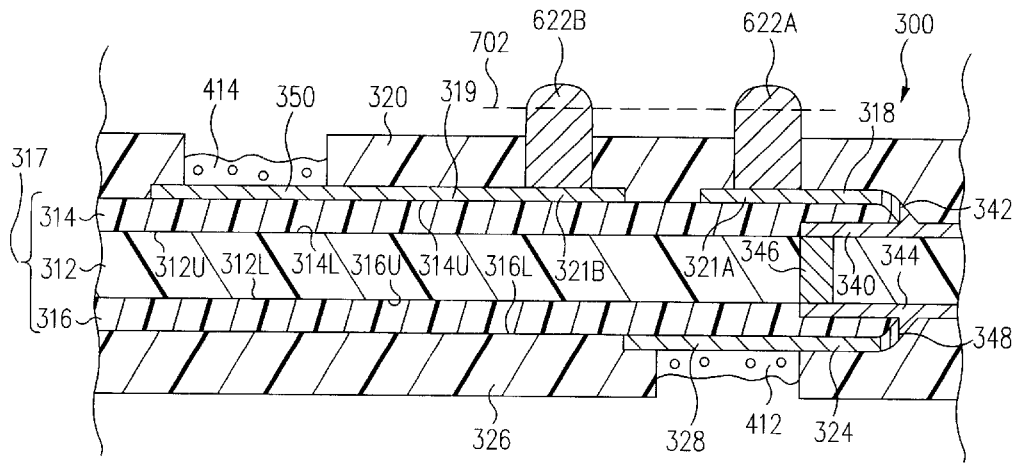

FIG. 7 is a cross-sectional view of substrate 300 at a further stage during processing in accordance with this embodiment of the present invention. Referring now to FIGS. 2, 6 and 7 together, in a flux residue removal operation 210, flux residue 604 is removed.

In one embodiment, flux residue 604 is removed by washing substrate 300 with water. Advantageously, OSP layers 412, 414 are substantially unaffected by water. Accordingly, a sufficient thickness of OSP layers 412, 414 remains on lower solder mask defined bond pad 328 and upper solder mask defined bond pad 350, respectively, after removal of flux residue 604. More 414 remains to inhibit oxidation of lower solder mask defined bond pad 328 and upper solder mask defined bond pad 350, respectively.

In one particular embodiment, flux residue 604 is removed within fifteen minutes after reflow of solder pastes 522A, 522B, i.e., within fifteen minutes after formation of solder-on-pads 622A, 622B. In this manner, flux residue 604 is removed before weak organic acid residues of flux residue 604 become difficult to remove. It is important to remove any weak organic acid residues since these residues may cause subsequent reliability failures, such as leakage currents.

In another embodiment, flux residue 604 is removed by washing substrate 300 with a nonaqueous cleaning solvent. However, this nonaqueous cleaning solvent may attack and cause unacceptable degradation of OSP layers 412, 414 depending upon the particular application.

Referring now to FIGS. 2 and 7 together, optionally, in a flatten solder operation 212, solder-on-pads 622A, 622B are flattened. More particularly, solder-on-pads 622A, 622B are flattened to extend to a common plane 702 (indicated as a dashed line) generally parallel to substrate 300. In this manner, any bump height variations of solder-on-pads 622A, 622B are eliminated to within acceptable tolerances. However, flatten solder operation 212 is optional, and in an alternative embodiment, flatten solder operation 212 is not performed.

Substrate 300 is used to form a wide variety of electronic packages and modules. To illustrate, in one embodiment, lower solder mask defined bond pad 328 and/or upper solder mask defined bond pad 350 is a ball grid array solder mask defined bond pad. Alternatively, lower solder mask defined bond pad 328 and/or upper solder mask defined bond pad 350 is a surface mounted device solder mask defined bond pad. As yet other alternatives, lower solder mask defined bond pad 328 is a ball grid array solder mask defined bond pad and upper solder mask defined bond pad 350 is a surface mounted device solder mask defined bond pad or vice versa. As a further alternative, bond pads 328, 350 are non-solder mask defined (NSMD) bond pads.

Advantageously, upper solder mask defined bond pad 350 coated with OSP layer 414 is formed on the same surface of substrate 300, i.e., on upper surface 314U, as flip chip solder mask defined bond pads 321A, 321B coated with solder-on-pads 622A, 622B.

Recall that in the prior art (FIG. 1), tape material 30 was applied to the top surface of substrate 10 to protect solder-on-pads 22 during application of the organic solderability protectant to BGA SMD bond pads 28. Necessarily, the organic solderability protectant was not applied to the top surface of substrate 10 due to the tape material 30 unless the tape material 30 was selectively patterned, which was impractical. Thus, in accordance with the present invention, a relatively simple and cost-effective method of forming flip chip solder mask defined bond pads coated with solder-on-pads on the same surface as solder mask defined bond pads coated with organic solderability protectant is presented.

Although one particular application of substrate 300 is discussed below and illustrated in FIG. 8, it is understood that substrate 300 has a wide variety of other applications.

Figure 8:
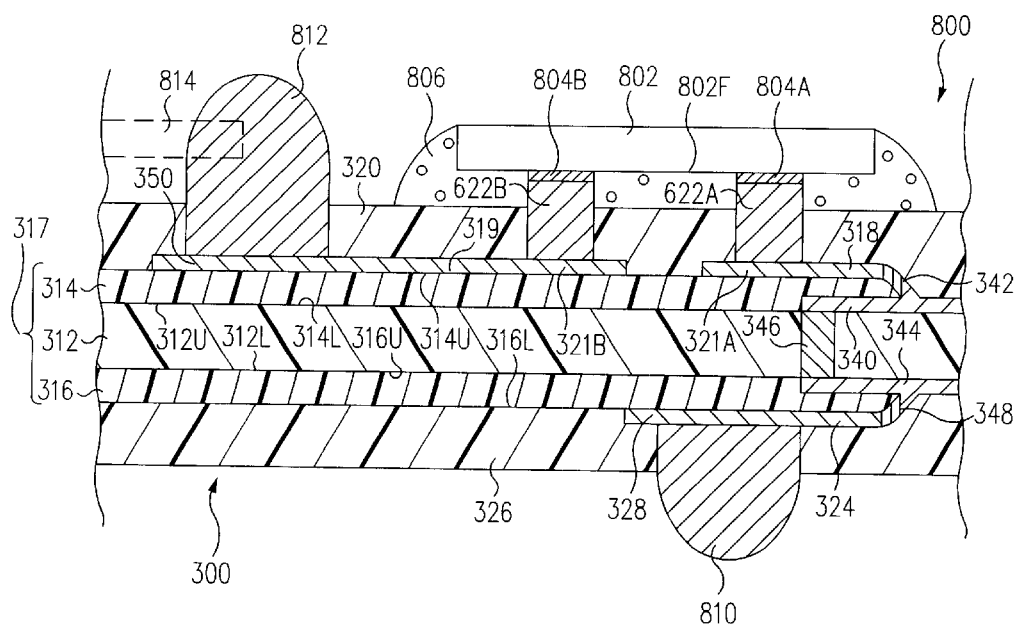
FIG. 8 is a cross-sectional view of a module formed with the substrate of FIGS. 3–7 in accordance with one embodiment of the present invention.

FIG. 8 is a cross-sectional view of a module 800 formed with substrate 300 in accordance with one embodiment of the present invention. Referring now to FIGS. 2 and 8 together, in a flip chip die attach operation 214, an integrated circuit chip 802 is flip chip mounted to substrate 300.

Illustratively, integrated circuit chip 802 includes die pads 804A, 804B on a front surface 802F of integrated circuit chip 802. Die pads 804A, 804B (or solder bumps on die pads 804A, 804B) are aligned and placed in contact with solder-on-pads 622A, 622B, respectively. Module 800 is heated to reflow solder-on-pads 622A, 622B. After reflow, solder-on-pads 622A, 622B bond die pads 804A, 804B to flip chip solder mask defined bond pads 321A, 321B, respectively. In one embodiment, an underfill material 806 is applied in a conventional manner.

Referring now to FIGS. 2, 7 and 8 together, in a solder ball formation operation 216, a BGA solder ball 810 and a surface mount solder ball 812 are formed. More particularly, BGA solder ball 810 is formed on solder mask defined bond pad 328, which is a BGA solder mask defined bond pad in this embodiment. Similarly, surface mount solder ball 812 is formed on solder mask defined bond pad 350, which is a surface mounted device solder mask defined bond pad in this embodiment.

Illustratively, solder paste is applied to solder mask defined bond pads 328, 350 and, more specifically, to OSP layers 412, 414. This solder paste is reflowed to form BGA solder ball 810 and surface mount solder ball 812. Advantageously, OSP layers 412, 414 insure that BGA solder ball 810 and surface mount solder ball 812 entirely wet solder mask defined bond pads 328, 350, respectively. OSP layers 412, 414 are consumed during formation of BGA solder ball 810 and surface mount solder ball 812. Accordingly, BGA solder ball 810 and surface mount solder ball 812 are formed directly on and contact solder mask defined bond pads 328, 350, respectively.

Advantageously, contact metallizations, e.g., Ni/Au, between BGA solder ball 810, surface mount solder ball 812 and solder mask defined bond pads 328, 350, respectively, are unnecessary. However, in an alternative embodiment, contact metallizations are provided between BGA solder ball 810, surface mount solder ball 812 and solder mask defined bond pads 328, 350, respectively.

In an alternative embodiment, referring now to FIGS. 2 and 8 together, BGA solder ball 810 and surface mount solder ball 812 are formed simultaneously with solder-on-pads 622A, 622B. More particularly, solder paste is also applied to solder mask defined bond pads 328, 350 during solder paste application operation 206. This solder paste is reflowed to form BGA solder ball 810 and surface mount solder ball 812 during solder paste reflow operation 208.

Illustratively, referring now to FIG. 8, surface mount solder ball 812 is used to form an electrical connection between a lead 814, sometimes called a contact, of a surface mounted electronic component and upper solder mask defined bond pad 350. BGA solder ball 810 is used to form an electrical connection between a lead, sometimes called a contact, of a larger substrate such as a printed circuit mother board and lower solder mask defined bond pad 328.

This application is related to Scanlan et al., co-filed and commonly assigned U.S. patent application Ser. No. 09/770, 859 entitled "SEMICONDUCTOR MODULE PACKAGE SUBSTRATE", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claim is:

1. A method comprising:

forming a first organic solderability protectant layer coupled to a flip chip bond pad;

forming a second organic solderability protectant layer coupled to a first bond pad;

applying a solder paste to said first organic solderability protectant layer; and reflowing said solder paste to form a solder-on-pad coupled to said flip chip bond pad, said first organic solderability protectant layer being consumed during said reflowing, wherein said second organic solderability protectant layer remains after said reflowing.

2. The method of claim 1 wherein said reflowing is performed in an inert atmosphere.

3. The method of claim 1 wherein said reflowing is performed in an oxygen deficient atmosphere.

4. The method of claim 1 wherein a sufficient thickness of said second organic solderability protectant layer remains after said reflowing to inhibit oxidation of said first bond pad.

5. The method of claim 1 wherein flux residue from said solder paste is generated during said reflowing.

6. The method of claim 5 further comprising removing said flux residue, wherein said second organic solderability protectant layer remains after said removing.

7. The method of claim 1 wherein water soluble flux residue from said solder paste is generated during said reflowing, said method further comprising water washing to remove said water soluble flux residue, said second organic solderability protectant layer being unaffected by said water washing.

8. The method of claim 1 wherein water soluble flux residue from said solder paste is generated during said reflowing, said method further comprising water washing to remove said water soluble flux residue, said second organic solderability protectant layer remaining after said water washing.

9. The method of claim 1 wherein said solder paste is water soluble, said method further comprising removing flux residue generated during said reflowing with water.

10. The method of claim 1 wherein said flip chip bond pad and said first bond pad are coupled to a first surface of a dielectric substrate layer.

11. The method of claim 10 wherein said flip chip bond pad is electrically coupled to said first bond pad.

12. The method of claim 1 further comprising:

forming a third organic solderability protectant layer coupled to a second bond pad, wherein said third organic solderability protectant layer remains after said reflowing.

13. The method of claim 12 wherein said flip chip bond pad and said first bond pad are coupled to a first surface of a dielectric substrate layer and wherein said second bond pad is coupled to a second surface of said dielectric substrate layer.

14. The method of claim 13 wherein said flip chip bond pad is electrically coupled to said second bond pad.

15. The method of claim 1 wherein said first organic solderability protectant layer is formed directly on and in contact with said flip chip bond pad.

16. The method of claim 1 wherein said second organic solderability protectant layer is formed directly on and in contact with said first bond pad.

17. The method of claim 1 wherein said first organic solderability protectant layer is formed directly on and in contact with said flip chip bond pad and wherein said second organic solderability protectant layer is formed directly on and in contact with said first bond pad.

18. The method of claim 1 wherein said first organic solderability protectant layer makes said flip chip bond pad solder wettable.

19. The method of claim 1 wherein said second organic solderability protectant layer makes said first bond pad solder wettable.

20. A method comprising:

forming a first organic solderability protectant layer directly on a copper flip chip solder mask defined bond pad;

forming a second organic solderability protectant layer directly on a copper first solder mask defined bond pad;

applying a solder paste directly to said first organic solderability protectant layer; and reflowing said solder paste in an inert atmosphere to prevent said second organic solderability protectant layer from being consumed during said reflowing, said reflowing forming a solder-on-pad directly on said copper flip chip solder mask defined bond pad.

21. A method comprising:

forming a first organic solderability protectant layer coupled to a flip chip solder mask defined bond pad;

forming a second organic solderability protectant layer coupled to a first solder mask defined bond pad;

applying a solder paste to said first organic solderability protectant layer; and reflowing said solder paste in an oxygen deficient atmosphere to prevent said second organic solderability protectant layer from being consumed during said reflowing, said reflowing forming a solder-on-pad directly on said flip chip solder mask defined bond pad.

22. A method comprising:

forming a first organic solderability protectant layer coupled to a flip chip solder mask defined bond pad;

forming a second organic solderability protectant layer coupled to a first solder mask defined bond pad;

applying a water soluble solder paste to said first organic solderability protectant layer;

reflowing said solder paste to form a solder-on-pad coupled to said flip chip solder mask defined bond pad, wherein water soluble flux residue is generated during said reflowing; and removing said water soluble flux residue with water, said second organic solderability protectant layer remaining after said reflowing and said removing.

23. A method comprising:

forming a first organic solderability protectant layer coupled to a flip chip solder mask defined bond pad coupled to a first surface of a dielectric substrate layer;

forming a second organic solderability protectant layer coupled to a surface mounted device bond pad coupled to said first surface of said dielectric substrate layer;

forming a third organic solderability protectant layer coupled to a ball grid array bond pad coupled to a second surface of said dielectric substrate layer opposite said first surface;

applying a solder paste to said first organic solderability protectant layer;

reflowing said solder paste to form a solder-on-pad coupled to said flip chip solder mask defined bond pad; and wherein a sufficient thickness of said second organic solderability protectant layer remains after said reflowing to inhibit oxidation of said surface mounted device bond pad.

24. A method comprising:

forming a first organic solderability protectant layer coupled to a flip chip bond pad;

forming a second organic solderability protectant layer coupled to a first bond pad;

applying a water soluble solder paste to said first organic solderability protectant layer;

reflowing said solder paste to form a solder on-pad coupled to said flip chip bond pad, wherein water soluble flux residue is generated during said reflowing; and removing said water soluble flux residue with water, said second organic solderability protectant layer remaining after said reflowing and said removing.

* * * * *